United States Patent [19]

Manasevit

[11] 4,447,497

[45] May 8, 1984

[54] CVD PROCESS FOR PRODUCING MONOCRYSTALLINE SILICON-ON-CUBIC ZIRCONIA AND ARTICLE PRODUCED THEREBY

[75] Inventor: Harold M. Manasevit, Anaheim, Calif.

[73] Assignee: Rockwell International Corporation, El Segundo, Calif.

[21] Appl. No.: 373,929

[22] Filed: May 3, 1982

[51] Int. Cl.$^3$ .................... C30B 23/06; C30B 25/18; H01L 21/205

[52] U.S. Cl. .................................. 428/446; 428/700; 156/605; 156/612; 156/613; 156/DIG. 66; 156/DIG. 95

[58] Field of Search ............... 156/605, 610, 612, 613, 156/DIG. 64, DIG. 66, DIG. 95; 428/446, 700; 148/187, 191; 357/4

[56] References Cited

U.S. PATENT DOCUMENTS

| | | | |
|---|---|---|---|
| 3,414,434 | 12/1968 | Manasevit | 428/446 |
| 3,475,209 | 10/1969 | Manasevit | 428/446 |
| 3,493,430 | 2/1970 | Manasevit | 156/613 |
| 3,515,576 | 6/1970 | Manasevit | 156/613 |
| 3,661,636 | 5/1972 | Green et al. | 156/610 |
| 3,796,597 | 3/1974 | Porter et al. | |
| 3,847,686 | 11/1974 | Stein | |
| 3,864,162 | 2/1975 | Kenty | 156/612 |
| 3,926,715 | 12/1975 | Süssmann | 156/612 |
| 4,105,456 | 8/1978 | Murakami et al. | 428/446 |
| 4,177,321 | 12/1979 | Nishizawa | 427/87 |
| 4,220,483 | 9/1980 | Cazcarra | 156/612 |

FOREIGN PATENT DOCUMENTS

| | | | |
|---|---|---|---|
| 2501799 | 7/1976 | Fed. Rep. of Germany | 156/DIG. 95 |
| 113473 | 10/1978 | Japan | 156/612 |

OTHER PUBLICATIONS

V. S. Stubican, R. C. Hink, and S. P. Ray, "Phase Equilibria and Ordering in the System $ZrO_2-Y_2O_3$," J. Amer. Ceramic Society (attached).

Information to Offerors Or Quoters, F33615-8-1-R-5041, U.S. Air Force.

*Primary Examiner*—David L. Lacey

*Attorney, Agent, or Firm*—H. Fredrick Hamann; Daniel R. McGlynn

[57] ABSTRACT

A method for producing monocrystalline semiconductor-on-insulator structures and article produced thereby, by the steps of heat treating a polished substrate of cubic zirconia to approximately 1150°–1400° C. for time to remove sufficient oxygen from the substrate in order to stabilize the surface; lowering the temperature to below 1075° C.; and depositing a thin monocrystalline layer of a semiconductor material on the stabilized surface, by a chemical vapor deposition process.

24 Claims, 2 Drawing Figures

CVD PROCESS FOR PRODUCING MONOCRYSTALLINE SILICON-ON-CUBIC ZIRCONIA AND ARTICLE PRODUCED THEREBY

ORIGIN OF THE INVENTION

The invention herein described was made in the course of or under a contract or subcontract thereunder with the Department of the Air Force.

BACKGROUND OF THE INVENTION

1. Field of the Invention

The invention relates to semiconductor-on-insulator structures, and in particular to a process for producing epitaxial silicon-on-cubic zirconia structures.

2. Description of the Prior Art

Yttria-stabilized Cubic Zirconia (YSZ) has recently become commercially available in large single-crystal form. It has several attractive properties which make it a potential substrate for the growth of silicon and other semiconductors, namely (a) its cubic structure and (b) the ability of varying the lattice parameter by controlling the $Y_2O_3$-$ZrO_2$ composition. For silicon, compositions within the range $(Y_2O_3)_{0.07}(ZrO_2)_{0.93}$ to $(Y_2O_3)_{0.33}(ZrO_2)_{0.67}$ are of interest, since this range is consistent with a cubic structure. This composite range encompasses a lattice parameter range of about 5.14 angstroms to 5.23 angstroms, slightly smaller than that of silicon (5.43 angstroms).

The technique of producing the invention is directed to a method of producing single crystal semiconducting layers epitaxially on insulating substrate crystals and particularly to improvement in the art as taught in U.S. Pat. Nos. 3,414,434, H. M. Manasevit and 3,424,955, H. Seiter and C. Zaminer.

SUMMARY OF THE INVENTION

Briefly and in general terms, the invention concerns a method for producing monocrystalline semiconductor-on-insulator structures by the steps of heat treating a polished substrate of cubic zirconia to approximately 1150°-1400° C. for time to remove sufficient oxygen from the substrate in order to stabilize the surface; lowering the temperature to below 1075° C.; and depositing a thin monocrystalline layer of a semiconductor material on the stabilized surface. In particular, the deposition step is done by a chemical vapor deposition process.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1:
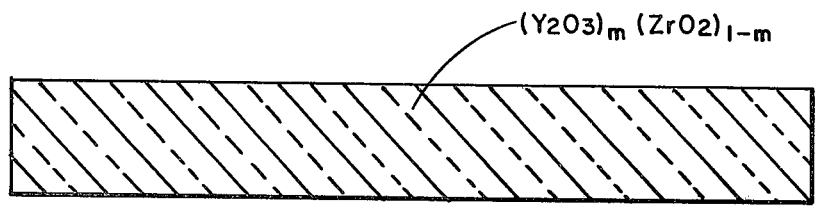
FIG. 1 is a highly simplified cross-sectional view of a cubic zirconia substrate.

Chemical vapor disposition (CVD) is a process in which chemicals in the gas or vapor phase are reacted at the surface of a heated substrate to form the solid product. The use of CVD processes are known in the semiconductor industry for depositing various amorphous and glassy insulators as well as dielectrics, elemental and compound semiconductors, conductors and superconductors on the surface of a substrate. The present invention is directed to the application of the CVD process to the formation of an epitaxial silicon-on-zirconia composite structure.

High-quality submicron-thick, single-crystal Si films on insulating substrates are highly desirable for use in fabricating high speed, high density, radiation-hard integrated circuits. The current state-of-the-art material is chemically-vapor-deposited (CVD) silicon-on-sapphire (SOS).

This early technique was subsequently expanded to include epitaxial (monocrystalline) Si grown by CVD on other insulating substrates such as spinel, beryllium oxide, and chrysoberyl, and the growth of a host of different compound semiconductors and alloys by met-alorganic-CVD (MOCVD) on these same kind of insulators. The only film-insulator combination that has been put to a practical use to date seems to be SOS, and specifically (100) Si on (1$\bar{1}$02) sapphire. For device purposes, 0.5–0.6 µm thick SOS films are routinely used in fabricating large scale integrated circuits with device dimensions down to and sometimes below 2 µm. But the quality of these thin films is inferior to that of bulk Si. This has been attributed to the thermal and lattice mismatches between film and substrate. Successful efforts have been made in recent years to improve films for device applications. Ideally, however, the use of the as-grown Si films without regrowth steps would be preferred.

The present invention is a CVD process to form Si on single-crystal yttria-stabilized cubic zirconia (YSZ) substrates. YSZ is a defect solid solution, the defects being oxygen vacancies created to preserve lattice neutrality when $Y^{+3}$ ions are substituted for $Zr^{+4}$ ions in the fluorite-type structure. These vacancies give rise high oxygen ion mobilities. (C. Wagner, Naturwissenschaften, Vol. 31, 265 (1943)).

From a practical standpoint, YSZ is presently commercially available as large single crystals with linear dimensions up to about 5 cm. In this form it has been used mainly as a diamond substitute in the jewelry industry. In the past the use of zirconia containing yttria, calcia, or other additives to stabilize the cubic phase, was limited mostly to polycrystalline material and to its high temperature ionic-oxygen-conducting properties. (D. W. Strickler and W. G. Carlson, J. Amer. Ceram. Society, Vol. 47, 122 (1964); W. D. Kingery, J. Pappis, M. E. Doty, and D. C. Hill, J. Amer. Ceram. Society, Vol. 42, 393 (1959)). The $ZrO_2$-$Y_2O_3$ system has been studied by several investigators, e.g., D. Duwez, F. H. Brown, Jr., and F. Odell, J. Electrochem. Soc. Vol. 98, 356 (1951); and H. G. Scott, J. Matr. Sci., Vol. 10, 1527 (1975). It was determined that YSZ containing about 7 to 40 mole percent yttria possesses the cubic ($CaF_2$) structure and depending upon its $Y_2O_3$ content can vary in lattice parameter from 5.14 to 5.23 angstroms, compared to 5.43 angstroms for Si. Thus, it is better lattice matched to Si than is sapphire (where the lattice mismatch is on the order of 10 percent). Its thermal expansion between room temperature and 1000° C. (for about 9 mole % $Y_2O_3$) is about $1.12 \times 10^{-2}$, $\approx 30$ percent greater than that of sapphire. The present invention provides single crystal epitaxial growth of Si on YSZ, with film orientations that parallel those of the substrate. In addition, subsequent analysis has shown that the crystal quality of 0.5 μm-thick (100)-oriented films has been found to be better than that of commercially available SOS.

Single-crystal YSZ boules having nominal yttria mole fractions, m, of 0.09, 0.12, 0.18 and 0.33 [$(Y_2O_3)_m(ZrO_2)_{1-m}$], grown by the skull melting technique, were obtained from Ceres Corporation, Waltham, MA., and Singh Industries, Randolph, NJ. The skull melting technique uses a specially-shaped radio frequency apparatus for melting the source powders and employs solidification of the melt and crystal formation in a skull of its own composition. These special boules have been in most cases sufficiently large in size to cut substrates of at least 0.5×0.5 inch dimensions in any orientation, although much larger crystals can be grown by the skull melting selfcrucible technique. Boules were oriented by means of x-ray diffraction (XRD), sliced, and polished at Rockwell into 30 mil (0.75 mm) thick wafers having the (100), (110), and (111) crystallographic orientations. Wafers were first lapped with a diamond slurry and then chemically-mechanically polished to obtain an "epitaxial quality" surface finish. Reflection electron diffraction (RED) and MeV $^4He^+$ Rutherfordbackscattering (RBS) and channeling measurements indicated that the as-polished YSZ surfaces were of relatively high crystal quality.

Figure 2:
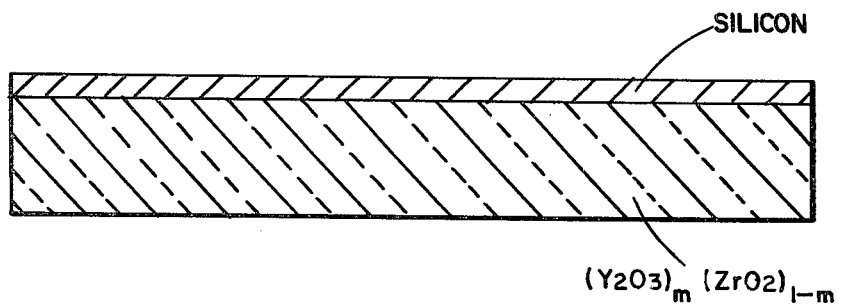
FIG. 2 is a highly simplified view of an epitaxial semiconductor layer on the cubic zirconia substrate formed according to the present invention.

In particular, the present invention begins with a substrate of cubic zirconia, shown in FIG. 1. The process according to the invention consists of a method for producing monocrystalline semiconductor-on-insulator structures by first heat treating the polished substrate of cubic zirconia to approximately 1150°–1400° C. for time to remove sufficient oxygen from the substrate in order to stabilize the surface. Second, the temperature is then lowered to below 1075° C.; and then third a thin monocrystalline layer of a semiconductor material is deposited on the stabilized surface, as is shown in FIG. 2. The heat treating step takes place in a reducing atmosphere, such as an atmosphere which contains hydrogen. Although a broad heat treating range is specified, preferably the heat treating step takes place at approximately 1250° C. Alternatively the heat treating step can take place in a vacuum.

The step of depositing a semiconductor material is preferably depositing silicon, in which case the step of lowering the temperature is to the approximate range of 950°–1075° C.

For example, with a crystallographic orientation of (100), a temperature of 950°–1025° C. is preferred. For a crystallographic orientation of the substrate of (110), a temperature range of 975°–1025° C. is preferred. Finally, for a crystallographic orientation of the substrate of (111), a preferred temperature range is 1050°–1075° C.

Although the present invention is described using a cubic zirconia substrate, similar oxygen-ion solid solution substrates are also within the scope of the present invention.

Si films were grown at 1 atm pressure via the pyrolysis of a silane ($SiH_4$) in a vertical, cold-wall quartz reactor. The gas and flow rates generally used were as follows: Pd-purified $H_2$ as the carrier, 3000 cm$^3$/min, and 5% $SiH_4$-in-He, 10–100 cm$^3$/min. The substrates were cleaned in organic solvents and then heated in the reactor on a rotating, RF coupled, SiC-coated graphite susceptor, about 2.2" in diameter. Before each growth experiment, the reactor portion of the system was evacuated to at least $10^{-3}$ Torr pressure, and then filled with purified flowing $H_2$ prior to heating the susceptor. Temperature measurements were made with an optical pyrometer on the side of the susceptor. At 1000° C. (the as-measured side temperature) the top of the susceptor was about 50° C. cooler than the side. After deposition, selected films were characterized by Nomarski optical and scanning electron microscopies (SEM), RED, XRD, RBS/channelling, SIMS, and electrical measurements.

It was found that the substrates changed color during the process of being heated in $H_2$ to the temperature prepared for Si growth. The color range—from colorless to yellow to orange to yellow-brown to black—was found to begin at about 475° C. and to continue progressively with temperature increase, the final color also being a function of the time of exposure to $H_2$, the maximum temperature of exposure, and the composition of the substrate. In the latter case, the lower the $Y_2O_3$ content, the more quickly the substrate turned black. Heating under somewhat poor vacuum conditions (about $10^{-3}$ Torr) or flowing high purity $LN_2$-trapped He gas (6–9's purity) caused only slight changes in substrate color. For example, 90 minutes in flowing He at about 1250° C. turned an 18 mole % $Y_2O_3$-containing substrate light yellow; in $H_2$, under the same thermal conditions, it was black. The darkening of YSZ substrates in oxygen-poor ambients is related to the loss of oxygen from the substrates.

It was also observed that a substrate which was blackened at about 1250° C., in this case with a $Y_2O_3$ composition of about 12 mole percent, would on prolonged exposure in $H_2$ at a lower temperature (about 3 hours at 1000° C.) revert to a yellow-brown color.

Most studies were performed on YSZ boules with m=0.12 and 0.18 from which polished slices of all three orientations, (100), (110), and (111), were obtained. Initially, conditions were used that would have produced epitaxy on sapphire and on many other insulating substrates. However, these were found insufficient for epitaxy on YSZ. Polycrystalline uniformly-gray films were generated on the substrates at a growth rate of about 0.7 μm/min and over a growth temperature range of about 950°–1075° C. However, it was found that preheating of the substrate at elevated temperatures caused a change in the kind of Si growth that was obtained at about 1000° C. For example, it was observed that films grown at 1000° C. on substrates of 12 and 18 mole percent YSZ after heat treatment at 1150° and 1225° C. for about 15 minutes consisted of nonuniform island growth and partial coverage, with some crystallites displaying a high degree of order.

With the indication that a stable oxygen-deficient surface was probably necessary for the epitaxy of Si by the CVD technique (presumably any evolving $O_2$ would react with the $SiH_4$ and $H_2$ to generate $SiO_2$ at the surface and impede epitaxy), substrates of different composition and orientation were exposed to $H_2$ at about 1250° C. for various times. After 15 minutes, substrates with m=0.09 and 0.12 were black; with m=0.18 and 0.33, yellow-brown. After about 60 minutes at 1250° C. only those substrates with m=0.33 were still yellow-brown, but darker than the 15 minute treated one. No additional color change was obvious after three hours at 1250° C. The sequence of a high temperature etch (HTE) at about 1250° C. in $H_2$ for 60 minutes followed by growth in the range 950°–1075° C. was sufficient for epitaxy of silicon on YSZ (m=0.12 and 0.18). For (100)—oriented substrates, a preferred Si growth temperature range appeared to be 950°–1025° C.; for (110), 975°–1025°; and for (111), 1050°–1075° C. For multislice runs, some differences were observed in the visual quality of films grown on substrates of the same orientation but of different compositions. These differences may have been related to slight contamination from neighboring wafers.

Substrates with m=0.33 required an extended HTE in $H_2$ to provide a surface susceptible to epitaxial growth. In two separate experiments, simultaneous growth at about 1000° C. on (100)— and (110)—oriented substrates which had been exposed to a HTE in $H_2$ for 60 minutes and 180 minutes prior to film deposition led to epitaxy only on the 180-minute etched substrates. A minimum channelling yield ($X_o$) value of 0.11 (using 0.8 MeV $^4$He+ ions for channelling) on a 0.5 μm-thick (100) film showed it was not as good as films grown on substrates of lower m values, for which $X_o$ values as low as 0.07 were obtained.

While the invention has been illustrated and described as embodied in a CVD Process for Producing Silicon-On-Cubic Zirconia, it is not intended to be limited to the details shown, since various modifications and structural changes may be made without departing in any way from the spirit of the present invention. Although the example given above is performed at a pressure of one atmosphere, reduced pressures can be used in the process.

Compound semiconductors such as GaAs can also be grown by the process of the present invention.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A method for producing monocrystalline semiconductor-on-insulator structures comprising:
   removing sufficient oxygen from the surface of a polished insulating substrate of cubic zirconia by subjecting at least said surface to a heat treatment of approximately 1150°–1400° C. for a time in order to stabilize the surface of the substrate so that a semiconductor layer can be deposited thereon;
   lowering the temperature of said substrate to below 1075° C.; and
   depositing a thin monocrystalline layer of a semiconductor material on the stabilized surface of the substrate.

2. A method as defined in claim 1 wherein said step of removing oxygen takes place in a reducing atmosphere.

3. A method as defined in claim 2, wherein said reducing atmosphere comprises hydrogen.

4. A method as defined in claim 1 wherein said step of removing oxygen takes place at approximately 1250° C.

5. A method as defined in claim 1, wherein said step of removing oxygen takes place in a vacuum.

6. A method as defined in claim 1, wherein said step of depositing a semiconductor material comprises depositing silicon.

7. A method as defined in claim 6, wherein said step of lowering the temperature is to the approximate range of 950° C.–1075° C.

8. A method as defined in claim 1, wherein said depositing step consists of a chemical vapor deposition process.

9. A method as defined in claim 1, wherein said depositing step comprises depositing silicon from a silane-containing atmosphere.

10. An article of manufacture prepared by a product by process comprising the steps defined in claim 1.

11. A method for producing monocrystalline semiconductor-on-insulator structures comprising:
    heat treating a polished insulating substrate of yttria stabilized cubic zirconia consisting essentially of 7 to 40 mole percent yttria to approximately 1150°–1400° C. for a time to remove sufficient oxygen from the substrate in order to stabilize the surface of the substrate;
    lowering the temperature of said substrate to below 1075° C.; and
    depositing a thin monocrystalline layer of a semiconductor material on the stabilized surface of the substrate.

12. A method as defined in claim 11 wherein said heat treating step takes place in a reducing atmosphere.

13. A method as defined in claim 12, wherein said reducing atmosphere contains hydrogen.

14. A method as defined in claim 11, wherein said heat treating step takes place at approximately 1250° C.

15. A method as defined in claim 11, wherein said heat treating step takes place in a vacuum.

16. A method as defined in claim 11, wherein said step of depositing a semiconductor material comprises depositing silicon.

17. A method as defined in claim 16, wherein said step of lowering the temperature is to the approximate range of 950°–1075° C.

18. A method as defined in claim 11, wherein said depositing step consists of a chemical vapor deposition process.

19. A method as defined in claim 11, wherein said depositing step comprises depositing silicon from a silane-containing atmosphere.

20. An article of manufacture prepared by a process comprising the steps defined in claim 11.

21. A method as defined in claim 11, wherein said polished substrate has a (110) crystallographic orientation and the temperature is lowered to approximately 975°–1025° C.

22. A method as defined in claim 11, wherein said substrate has a (100) crystallographic orientation and the step of lowering the temperature to below 1075° C. is performed to approximately 950°–1025° C.

23. A method as defined in claim 11, wherein said substrate has a (111) crystallographic orientation and said temperature is lowered to approximately 1050°–1075° C.

24. A method as defined in claim 11 wherein said step of depositing a semiconductor material comprises depositing a compound semiconductor.

* * * * *